(12) United States Patent
Sarumaru et al.

(10) Patent No.: US 7,246,984 B2
(45) Date of Patent: Jul. 24, 2007

(54) METHOD AND APPARATUS FOR TRANSFERRING AN ARTICLE TO BE PROCESSED AND PROCESSING APPARATUS

(75) Inventors: Shogo Sarumaru, Takasago (JP); Hideshi Yamane, Takasago (JP); Katsumi Watanabe, Takasago (JP); Hiroyuki Ueno, Kyoto (JP); Hideki Adachi, Kyoto (JP); Eiji Fukatsu, Kyoto (JP)

(73) Assignees: Kabushiki Kaisha Kobe Seiko Sho, Kobe-shi (JP); Dainippon Screen Mfg. Co., Ltd., Kyoto-shi (JP)

( * ) Notice: Subject to any disclaimer, the term of this patent is extended or adjusted under 35 U.S.C. 154(b) by 241 days.

(21) Appl. No.: 10/801,007

(22) Filed: Mar. 16, 2004

(65) Prior Publication Data

US 2004/0240970 A1    Dec. 2, 2004

(30) Foreign Application Priority Data

Mar. 31, 2003    (JP)    .............................. 2003-096851

(51) Int. Cl.
*H01L 21/677*    (2006.01)
(52) U.S. Cl. ........................ 414/217; 414/672; 414/939
(58) Field of Classification Search ........... 414/222.09, 414/226.02, 672, 939, 941, 935, 217; 392/418; 298/15
See application file for complete search history.

(56) References Cited

U.S. PATENT DOCUMENTS

| | | | | |
|---|---|---|---|---|
| 3,651,957 A | * | 3/1972 | Ball et al. .............. | 414/226.02 |
| 5,037,262 A | * | 8/1991 | Moll et al. .............. | 414/222.04 |
| 5,100,502 A | * | 3/1992 | Murdoch et al. ......... | 414/744.1 |
| 5,643,366 A | * | 7/1997 | Somekh et al. ............. | 118/729 |
| 5,879,128 A | * | 3/1999 | Tietz et al. ................. | 414/757 |
| 5,954,072 A | * | 9/1999 | Matusita ..................... | 134/149 |
| 5,979,306 A | * | 11/1999 | Fujikawa et al. ............. | 100/90 |
| 6,000,227 A | * | 12/1999 | Kroeker ......................... | 62/62 |
| 6,331,095 B1 | * | 12/2001 | Hiroki .................... | 414/222.01 |
| 6,364,595 B1 | * | 4/2002 | Bonora et al. ........... | 414/416.1 |
| 6,485,248 B1 | * | 11/2002 | Taylor, Jr. .................... | 414/672 |
| 6,702,865 B1 | * | 3/2004 | Ozawa et al. ............... | 29/25.01 |
| 6,709,521 B1 | * | 3/2004 | Hiroki ........................ | 118/719 |
| 6,767,176 B2 | * | 7/2004 | Yudovsky et al. .......... | 414/672 |
| 6,846,380 B2 | * | 1/2005 | Dickinson et al. ..... | 156/345.31 |
| 6,857,838 B2 | * | 2/2005 | Kuroda ....................... | 198/394 |
| 6,895,032 B2 | * | 5/2005 | Watanabe et al. ........... | 373/110 |

FOREIGN PATENT DOCUMENTS

| | | |
|---|---|---|
| JP | 2503732 | 4/1996 |
| JP | 11-186360 | 7/1999 |
| JP | 3107310 | 9/2000 |

\* cited by examiner

*Primary Examiner*—Patrick Mackey
*Assistant Examiner*—Charles Greenhut
(74) *Attorney, Agent, or Firm*—Oblon, Spivak, McClelland, Maier & Neustadt, P.C.

(57) ABSTRACT

A transferring apparatus transfers an article to be processed, which is carried by a carrier device, to a holder provided in a processing chamber defined by a processing vessel and adapted to hold the article at a specified processing position. The transferring apparatus includes a temporarily holding member, and transfers the article from the intermediate position to the processing position after receiving the article carried by the carrier device at an intermediate position distanced from the holder and temporarily holding it. The temporarily holding member is retracted to a position in the outside of the processing vessel after the article is transferred.

5 Claims, 6 Drawing Sheets

METHOD AND APPARATUS FOR TRANSFERRING AN ARTICLE TO BE PROCESSED AND PROCESSING APPARATUS

BACKGROUND OF THE INVENTION

This invention relates to a transferring method and apparatus for loading and unloading an article to be processed such as a semiconductor wafer to and from a processing position inside a processing chamber defined in a processing vessel, and a high-pressure processing apparatus provided with the transferring apparatus.

In the case of loading and unloading a plate-shaped article to be processed such as a semiconductor wafer into and from a processing apparatus for applying a high-pressure processing or the like, a means for quickly, securely and stably carrying the article while protecting it is necessary. Apparatuses, for example, disclosed in Japanese Registered Utility Model No. 2503732, Japanese Unexamined Patent Publication No. H11-186360 and Japanese Patent No. 3107310 are known as such an apparatus.

In the apparatus disclosed in Japanese Registered Utility Model No. 2503732, a semiconductor substrate or an article to be processed is carried to various processing units or processing apparatuses by a second carrying mechanism after being unloaded from a cassette by a first substrate carrying mechanism and transferred from the first substrate carrying mechanism to the second carrying mechanism or, conversely, processed articles are returned to the cassette from the various processing apparatuses by the first and second substrate carrying mechanisms.

In this apparatus, the second substrate carrying mechanism which transfers the article to and from various processing apparatuses has such a construction as to support the article from below. Similar to this, in the apparatuses disclosed in Japanese Unexamined Patent Publication No. H11-186360 and Japanese Patent No. 3107310, parts thereof that serve to transfer the article to and from the processing apparatuses have such a construction as to support the article from below.

With such apparatuses in which the articles are directly transferred to the processing apparatuses and a portion of the carrying mechanism supports the article from below, the processing apparatuses need to be formed with a clearance through which the article supporting portion enters and exits from the processing apparatuses in order to avoid the interference of the processing apparatuses and the carrier device.

Particularly in the case that this carrying mechanism moves over a relatively long distance, the article supporting portion of the carrying mechanism is obliged to be solid and large since the articles need to be supported with a sufficient strength during carriage. Accordingly, the clearances for allowing the entrance and exit of the article supporting portion into and from the processing apparatuses tend to be enlarged as much.

Such an enlargement of the clearance leads to the enlargement of the processing chamber as a whole defined in the processing apparatus. Various other problems arise in the case that the processing apparatus applies a high-pressure processing. For example, the enlargement of the clearance leads to a longer time required to compress a processing gas and an increase in the amount of the processing gas used, resulting in a reduction in throughput.

Japanese Patent No. 3174691 shows a carrying mechanism which transfers a substrate between a substrate carrier device and a substrate processing apparatus. However, this carrying mechanism is always placed inside a processing chamber. Consequently, the processing chamber is required to have an increased space to accommodate the carrying mechanism.

SUMMARY OF THE INVENTION

An object of the present invention is to provide a method and an apparatus for transferring articles to be processed and a processing apparatus using such a transferring apparatus, which can solve the above problems.

According to an aspect of the present invention, an article to be processed is carried by a carrier device, and transferred to a holder which is provided in a processing chamber defined by a processing vessel and holds the article at a specified processing position. The article carried by the carrier device is received at an intermediate position near the holder by a temporarily holding member separate from the carrier device, and temporarily held. After the carrier device is retracted from the intermediate position, the temporarily holding member and the holder are relatively moved such that the article temporarily held by the temporarily holding member is transferred to the processing position. The temporarily holding member is retracted to a position in an outside of the processing vessel after the article is transferred to the processing position.

These and other objects, features, aspects, and advantages of the present invention will become more apparent from the following detailed description of the preferred embodiments/examples with reference to the accompanying drawings.

DETAILED DESCRIPTION OF THE PREFERRED EMBODIMENTS OF THE INVENTION

Figure 1:
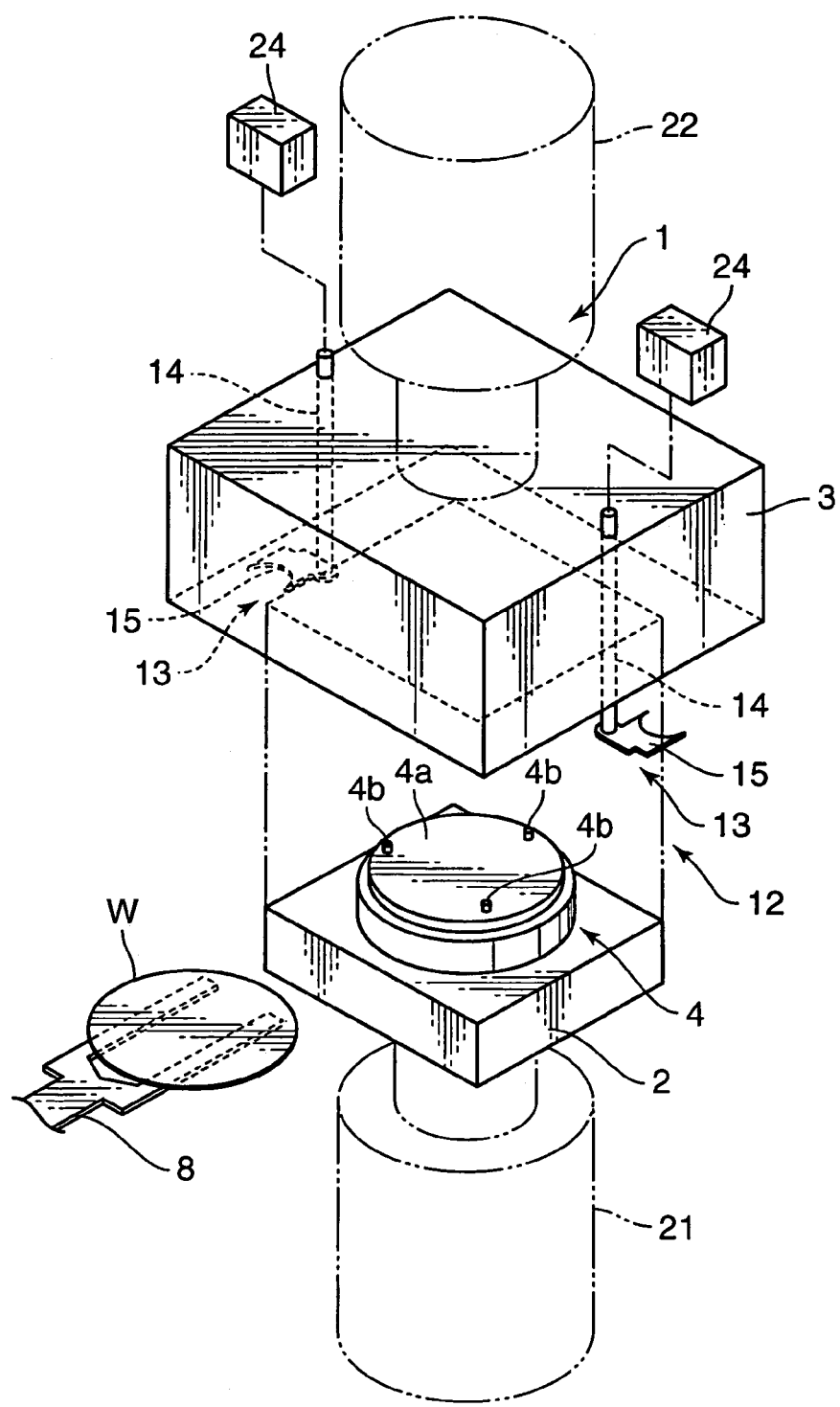
FIG. 1 is a perspective view showing a high-pressure processing apparatus according to an embodiment of the invention.
Figure 7:
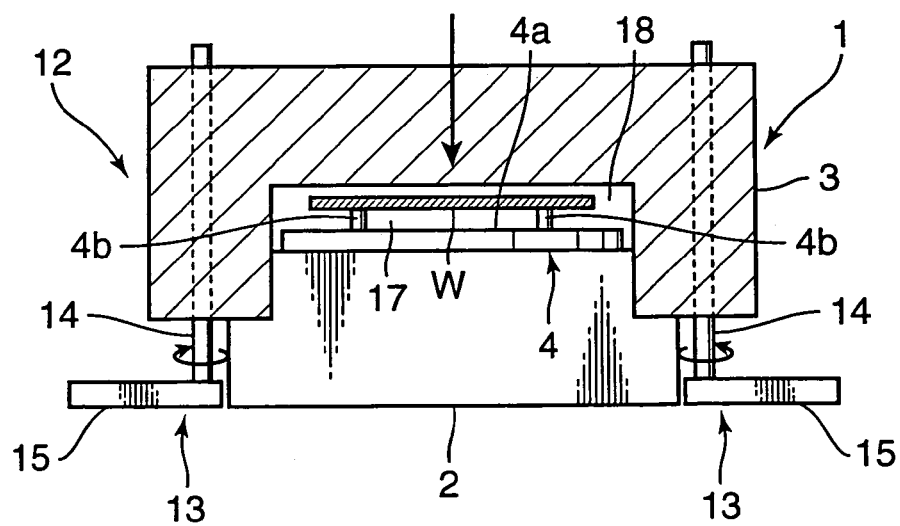
FIG. 7 is a side view partly in section showing an operative state following the one shown in FIG. 6.

Referring to FIG. 1 showing a high-pressure processing apparatus embodying the invention, this high-pressure processing apparatus 1 is provided with a pressure container as a processing vessel, which is comprised of a lower vessel member 2 corresponding to a first vessel member and an upper vessel member 3 corresponding to a second vessel member. The upper vessel member 3 is so shaped as to cover the lower vessel member 2 from above, and a sealed pressure chamber or processing chamber 18 is defined inside the two vessel members 2, 3 by vertically uniting the two vessel members 2, 3 as shown in FIG. 7.

In this embodiment, a holder 4 is integrally assembled on the lower vessel member 2. This holder 4 is so disposed as to face the processing chamber 18 and is exposed to the outside when the two vessel members 2, 3 are moved away from each other while serving as a holding portion for supporting a plate-shaped article W to be processed such as a semiconductor wafer at a processing position inside the processing chamber 18 when the two vessel members 2, 3 are united to define the processing chamber 18. In other words, the holder 4 is so disposed as to face the upper vessel member 3.

Specifically, the holder 4 includes a plurality of protuberances 4b projecting upward from an upper surface 4a of a table-shaped main body, and the article W is placed on these supporting protuberances 4b (i.e., the bottom surface of the article W is brought into contact with the supporting protuberances 4b), whereby the article W is held at the processing position and other parts of the bottom surface of the article W and the upper surface 4a of the main body of the holder 4 are vertically spaced apart to define a clearance 17.

The lower vessel member 2 is lowered from a united position as a reference position where it is united with the upper vessel member 3, thereby being retracted, while being raised to return to the united position. Likewise, the upper vessel member 3 is raised from the united position as a reference position, thereby being retracted, while being lowered to return to the united position. The two vessel members 2, 3 are opened and closed, i.e., united and separated by the upward and downward movements of these vessel members 2, 3, which are individually made by corresponding opening/closing means. The opening/closing means are preferably incorporated with driving sources such as cylinders 21, 22, for example, shown in FIG. 1.

Figure 2:
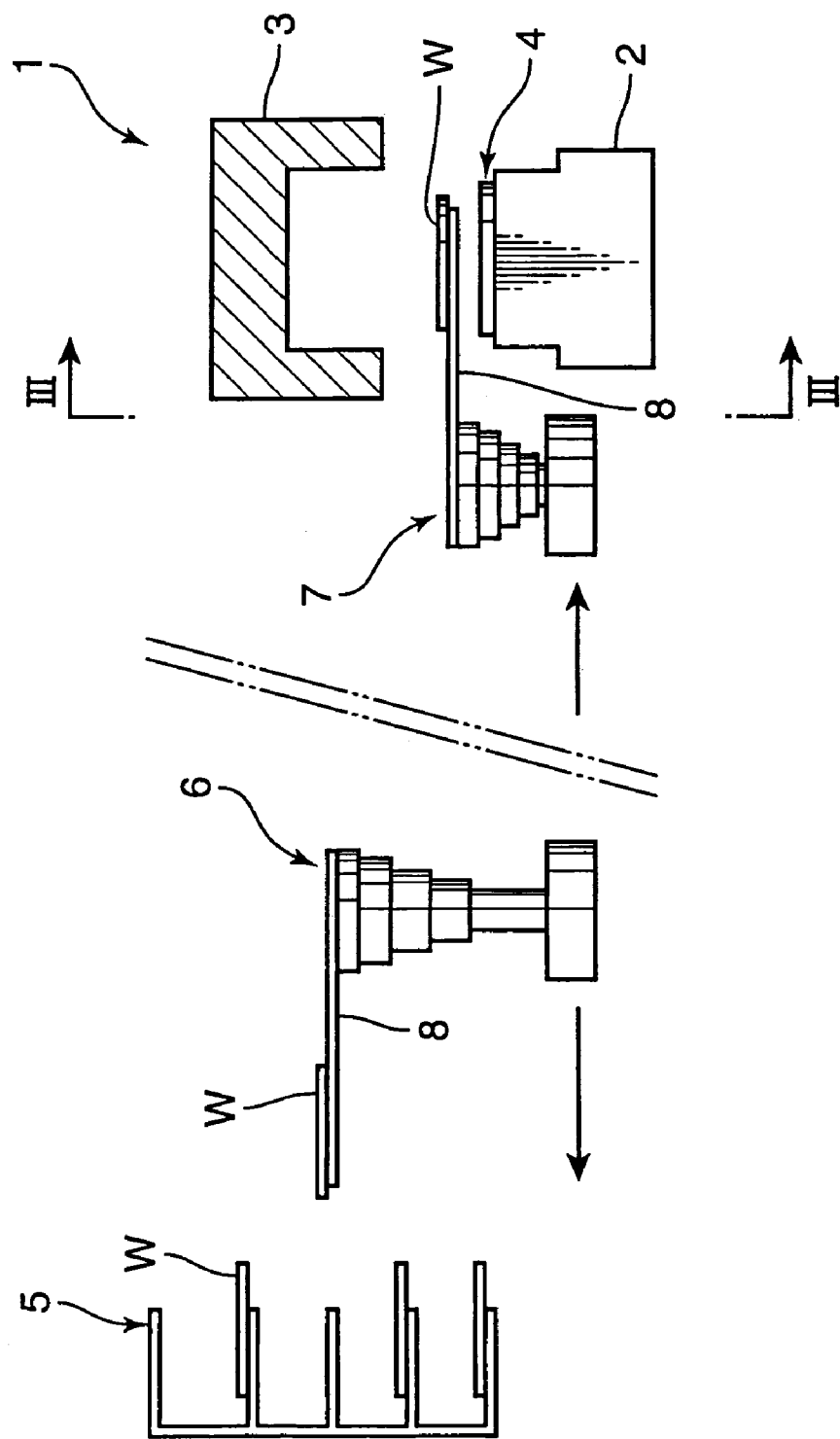
FIG. 2 is a side view partly in section showing an installation example of the high-pressure processing apparatus of FIG. 1.

FIG. 2 shows an exemplary carrier device for carrying the article W to the high-pressure processing apparatus 1. In this example, a specified number of articles W are taken out from a cassette 5 by a carrier device 6, transferred from the carrier device 6 to another carrier device 7, are loaded onto the holder 4 from the carrier device 7 via a transferring apparatus 12 to be described later.

Each of the carrier devices 6, 7 includes a forked article supporting portion 8 for supporting the article W from below as shown in FIG. 1. The carriage of the article W to the transferring apparatus 12 may be directly done by the carrier device 6 without using the carrier device 7.

The transferring apparatus 12 is adapted to assist the loading and unloading of the article W onto and from the holder 4 for a short time.

Specifically, when the article W is set at the processing position on the holder 4 from the carrier device 7 (or the carrier device 6), the transferring apparatus 12 first receives the article W from the carrier device 7 or the carrier device 6 at an intermediate position near the processing position, i.e., right above the processing position in the shown example, and then transfers it to the processing position on the holder 4. Conversely, when the article W is unloaded from the holder 4, the transferring apparatus 12 first receives the article W from the processing position on the holder 4 and then transfers it to the article supporting portion 8 of the carrier device 7 (or the carrier device 6) at the intermediate position.

In this embodiment, the transferring apparatus 12 is so mounted on the upper vessel member 3 so as to move together with the upper vessel member 3.

As shown in FIGS. 3 to 7, this transferring apparatus 12 includes a plurality of temporarily holding members 13, e.g., two in the shown example.

Each temporarily holding member 13 has a rotatable shaft 14 having a vertically extending longitudinal axis, and a receiving member (temporarily-holding-member main body) 15 fixed to the bottom end of the rotatable shaft 14.

The rotatable shafts 14 are driven to rotate about their longitudinal axes within a specified angle range (about 90° in an example shown in FIG. 5) by driving mechanisms 24 provided in the upper vessel member 3 or above the upper vessel member 3 as shown in FIG. 1. A driving mechanism incorporated with a stepping motor or other motor or a cylinder as a driving source can be used as the driving mechanism 24.

Figure 3:
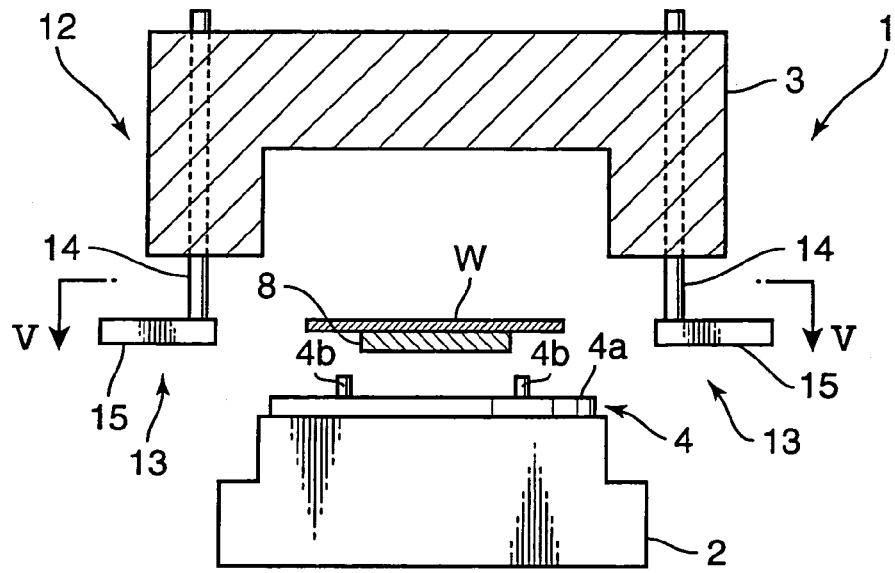
FIG. 3 is a side view partly in section showing an operative state of the high-pressure processing apparatus of FIG. 1, and substantially corresponding to a section taken along the line III-III in FIG. 2 when viewed in a direction of arrows.
Figure 4:
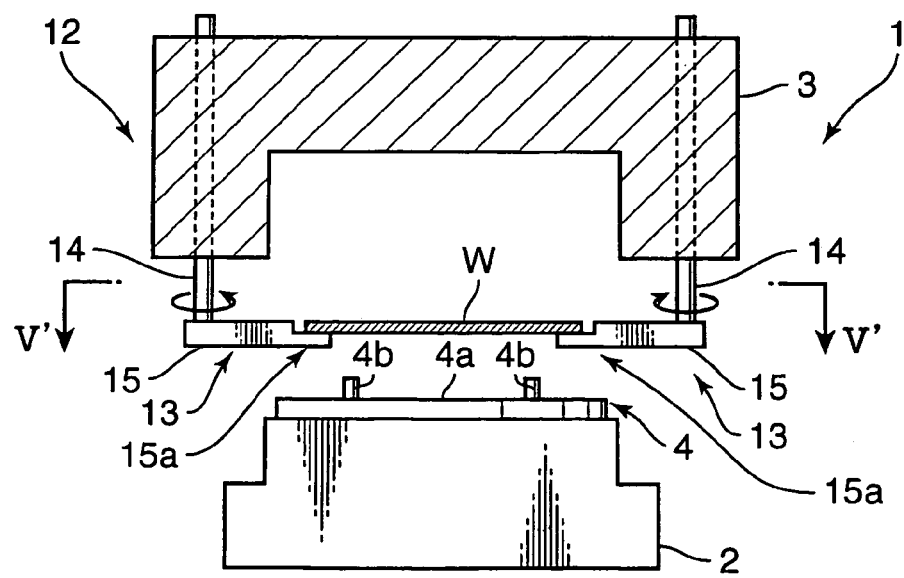
FIG. 4 is a side view partly in section showing an operative state following the one shown in FIG. 3.
Figure 5:
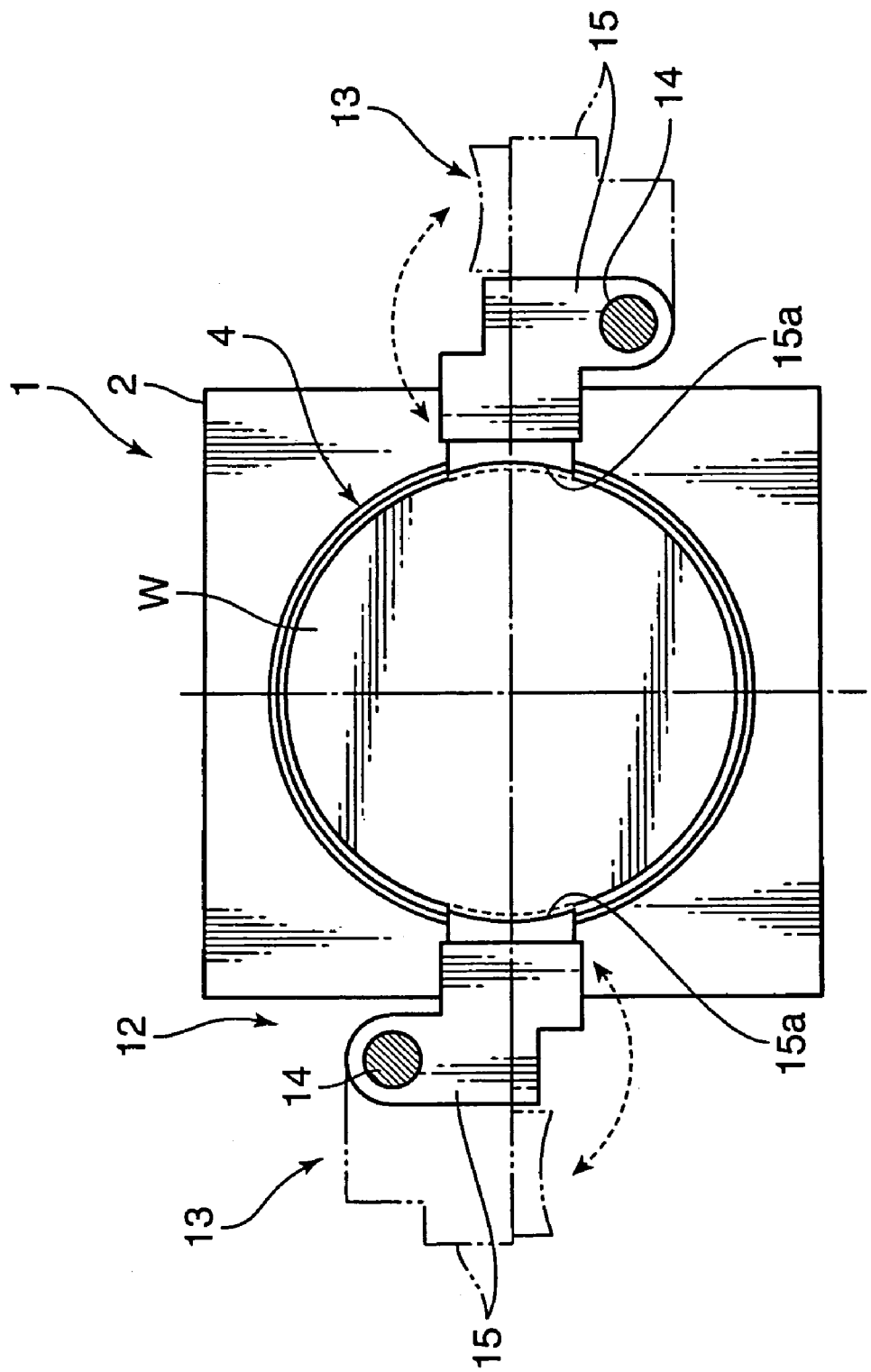
FIG. 5 is a view of a section take along the line V-V in FIG. 3 shown in solid lines when viewed in a direction of arrows with a section taken along the line V'-V' in FIG. 4 when viewed in a direction of arrows superimposed thereon.

The receiving members 15 radially project from the bottom ends of the rotatable shafts 14, and are switched between temporarily holding positions where the receiving members 15 project inward to hold the article W at the intermediate position as shown in FIG. 4 and retracted positions where the receiving members 15 are retracted outward from the temporarily holding position and project outward as shown in FIG. 3. In other words, the driving mechanisms 24 construct a position switcher, and the receiving members 15 are pivoted in a horizontal plane between the temporarily holding positions for holding the article W and the retracted positions retracted from the holding positions every time the rotatable shafts 14 are driven to rotate by the driving mechanisms 24.

The upper surface of each receiving member 15 at its projecting end is recessed to form a stepped portion 15a thinner than the other portion. This stepped portion 15a serves as an article supporting portion for supporting a part of the outer periphery of the article W from below.

A side wall portion of the stepped portion 15a facing the side surface of the article W is so formed as to conform to the outer shape of the article W. Since the article W takes a disk shape in this embodiment, the side wall portion of the stepped portion 15a takes an arcuate shape extending along the outer periphery of the article W when viewed from above. Thus, a large horizontal displacement of the article W can be corrected by the stepped portions 15a. However, the stepped portions 15a are so shaped as to ensure slight clearances between the side surface of the article W and the facing side surfaces of the stepped portions 15a of the receiving members 15 lest the article W should be horizontally displaced by the contact of the stepped portions 15a with the side surface of the article W.

It should be noted that the article may be held by the receiving members 15 such that the receiving members 15 are brought into contact with the side surface of the article W to press this side surface from opposite sides.

Specifically, while allowing the receiving members 15 to horizontally pivot similar to the above, a sufficient clearance is defined between the side surface of the article W and the facing side surface of the stepped portion 15a of each receiving member 15 lest the receiving members 15 should come into contact with the side surface of the article W to cause a horizontal displacement of the article W at the time of horizontally pivoting the receiving members 15, and the receiving members 15 are moved straight toward the article W or specific parts of the receiving members 15 extend straight toward the article W with the surfaces of the receiving members 15 and the article W to be brought into contact opposed to each other after the horizontal pivotal movements of the receiving members 15. Then, the article W can be held by the receiving members 15. According to this holding mode, a horizontal displacement of the article W can be corrected by the receiving members 15 to securely position the article W with respect to horizontal direction.

In the case of the apparatus provided with the two temporarily holding members 13 as in this embodiment, the article W is held at symmetrical positions on the outer periphery thereof. It is also possible to provide three or more temporarily holding members 13. In such a case, the respective temporarily holding members 13 are more preferably provided at even intervals along the outer periphery of the article W (at intervals of 120° in the case of three temporarily holding members 13, at intervals of 90° in the case of four temporarily holding members 13).

The position where the article W is held by the transferring apparatus 12 including such temporarily holding members 13, i.e., the intermediate position is set right above the holder 4. Thus, if the lower vessel member 2 is raised toward the united position with the upper vessel member 3, the upper vessel member 3 is lowered toward the united position with the lower vessel member 2 together with the transferring apparatus 12, or both of these movements of the lower and upper vessel members 2, 3 are made when the transferring apparatus 12 is holding the article W at the intermediate position, the article W comes to be placed at the processing position on the holder 4. Conversely, the transferring apparatus 12 raises the article W from the holder 4 to the intermediate position by movement(s) reverse from the above one(s) with the article W held on the holder 4.

Next, the loading and unloading of the article W performed upon applying a high-pressure processing to the article W in this high-pressure processing apparatus 1 are described.

When the two vessel members 2, 3 are separated from each other by at least one of the downward movement of the lower vessel member 2 and the upward movement of the upper vessel member 3 and the receiving members 15 are located at the retracted positions where they project outward as shown in FIG. 3, the article W is carried to the position (hereinafter, referred to as "intermediate position") right above the holder 4 on the lower vessel member 2 by the carrier device 7 (or the carrier device 6) with the article W placed on the article supporting portion 8.

Subsequently, the rotatable shafts 14 of the transferring apparatus 12 are rotated to move the respective temporarily holding members 13 from the retracted positions to the holding positions, i.e., the positions where the receiving members 15 project inward, whereby the article W is received at the intermediate position. Upon completing the receiving of the article W, the carrier device 7 (or the carrier device 6) is retracted from the intermediate position.

Figure 6:
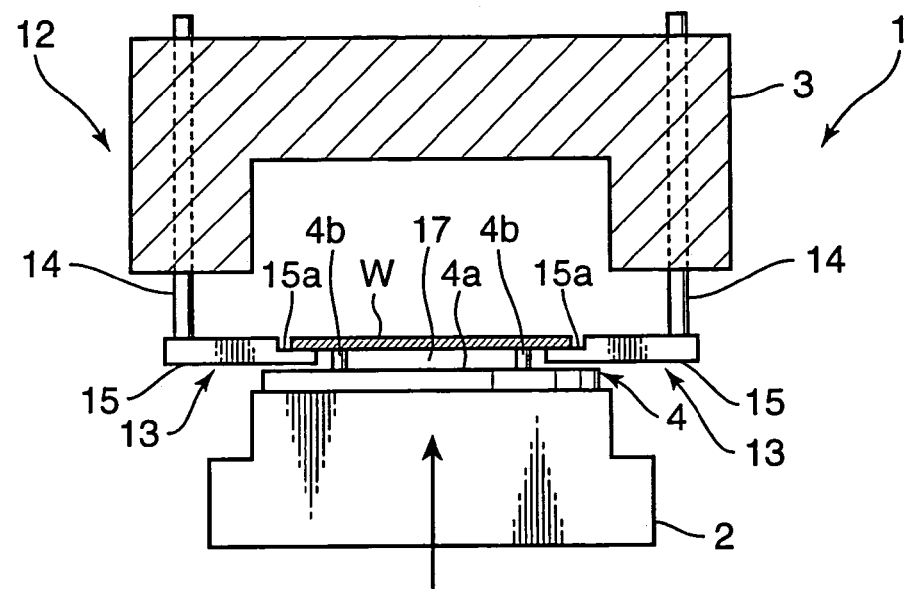
FIG. 6 is a side view partly in section showing an operative state following the one shown in FIG. 4.

Subsequently, the lower vessel member 2 is raised toward the united position with the upper vessel member 3, whereby the article W held at the intermediate position by the temporarily holding members 13 of the transferring apparatus 12 comes to be placed on a plurality of supporting protuberances 4b of the holder 4 to be held at the processing position as shown in FIG. 6. Alternatively, it may be appreciated to lower the upper vessel member 3. In other words, the transferring apparatus 12 is moved upward and downward relative to the holder 4 between the intermediate position for receiving the article W from the carrier device 7 (or the carrier device 6) and the position where the article W is held on the holder 4, i.e., the processing position.

At this time, the clearance 17 having a vertical dimension equal to a projecting distance of the supporting protuberances 4b is defined between the bottom surface of the article W and the upper surface 4a of the main body of the holder 4. Thus, if the vertical dimension of this clearance 17 is larger than the thickness of the stepped portions 15a of the receiving members 15, the interference of the receiving members 15 and the holder 4 can be avoided upon setting the article W on the holder 4.

After the article W is held by the holder 4 provided on the lower vessel member 2 in this way, the rotatable shafts 14 of the transferring apparatus 12 are rotated to move the respective temporarily holding members 13 from the article W to the retracted positions where the receiving members 15 project outward. Further, the upper vessel member 3 is lowered toward the united position with the lower vessel member 2 and united with the lower vessel member 2 to build a pressure container as shown in FIG. 7, whereby the pressure chamber 18 is defined inside the two vessel members 2, 3. The article W is stably held at the processing position by the holder 4 and the temporarily holding members 13 are located outside the pressure chamber 18.

In the respective conventional systems described above, an article to be processed is directly transferred from the carrier device to the processing apparatus and needs to be carried over a long distance by the carrier device. Thus, the article supporting portion of the carrier device is obliged to be solid and large in view of strength and the clearance through which the article supporting portion enters and exits from the processing apparatus needs to be larger. However, the temporarily holding members 13 do not carry the article W over a long distance and merely serve to temporarily hold the article W near the holder 4. Therefore, the temporarily holding members 13 can be thinner and smaller.

Accordingly, even if the temporarily holding members 13 support the article W from below, for example, as shown in FIG. 13 or even if the article supporting portion 8 of the carrier device 7 or the carrier device 6 is large, the thickness of the stepped portions 15a of the receiving members 15, which serve as the article supporting portions of the temporarily holding members 13, can be suppressed to take a small value. Thus, it is sufficient to define a small clearance (clearance 17 between the bottom surface of the article W and the upper surface 4a of the main body of the holder 4 in the shown example) below the article W in order to avoid the interference of the stepped portions 15a and the holder 4

A necessary space in the processing chamber 18 can be reduced by as much as a reduction in the vertical dimension of the clearance 17, whereby a reduction in throughput resulting from a longer time required to compress the processing gas in the processing chamber 18 and an increased amount of the processing gas used can be effectively suppressed.

Particularly in the shown example, the stepped portions 15a formed by locally thinning the end portions of the receiving members 15 serve as the article supporting portions. Thus, it is possible to suppress the thickness of the article supporting portions to a smaller value while maintaining a relatively higher strength of the entire receiving members 15.

Further, during the time when the article W is being processed, the temporarily holding member 13 is retracted to the outside of the processing chamber 18. For this reason, the temporarily holding member 13 is not required to have a pressure resistable structure. Also, in the conventional apparatus where a temporarily holding member is in a processing chamber when the high-pressure processing is carried out, there is the likelihood that the flow of the high-pressure fluid is disturbed due to the presence of the temporarily holding member. In this embodiment, however, since the temporarily holding member 13 is retracted to the outside of the processing chamber 18, there is not the likelihood of disturbance.

After the completion of the specified high-pressure processing by the high-pressure processing apparatus 1, a series of operations, i.e., the uniting and separation of the upper and lower vessel members 2, 3, the temporary holding of the article W (processed article at this stage) by the transferring apparatus 12, the transfer of the article W from the transferring apparatus 12 to the carrier device 7 or the carrier device 6, and the unloading of the article W by the carrier device 7 or the carrier device 6 are performed in an order reverse from the aforementioned order.

Embodiments of the present invention are not limited to the one described above and various changes can be suitably made.

Figure 8:
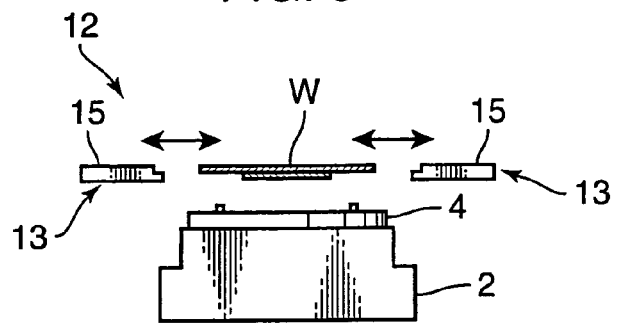
FIG. 8 is a side view showing a transferring apparatus according to another embodiment different from the one shown in FIGS. 1 to 7.
Figure 9:
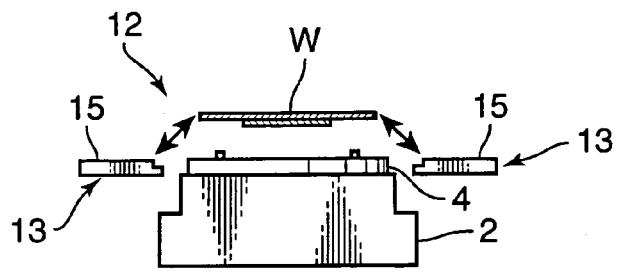
FIG. 9 is a side view showing a transferring apparatus according to still another embodiment different from those shown in FIGS. 1 to 8.
Figure 10:
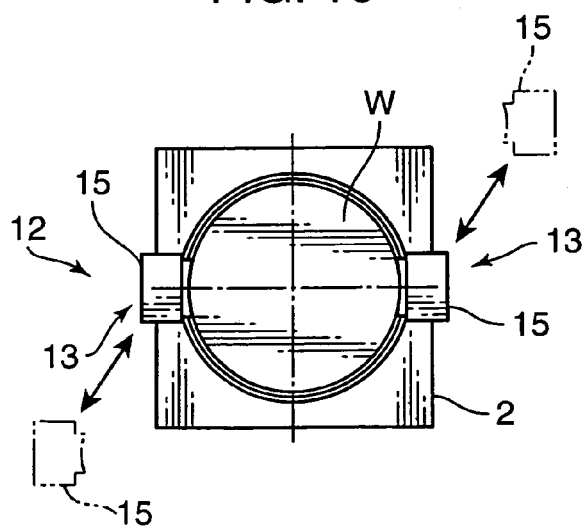
FIG. 10 is a side view showing a transferring apparatus according to further another embodiment different from those shown in FIGS. 1 to 9.

First, the temporarily holding members 13 of the transferring apparatus 12 may be switched between the temporarily holding positions and the retracted positions by linear movements. For example, in the case that the temporarily holding members 13 are constructed such that the receiving members 15 thereof support the article W from below, the positions of the receiving members 15 can be switched by straight horizontal movements of the receiving members 15 along radial directions of the article W as shown in FIG. 8, by straight movements of the receiving members 15 in obliquely upward directions from the retracted positions to the temporarily holding positions as shown in FIG. 9, and by straight movements of the receiving members 15 in oblique directions on the same plane as shown in FIG. 10.

In this case, a "position switcher" is constructed by a cylinder or an other sliding mechanism for moving the receiving members 15 straight.

Although the transferring apparatus 12 is incorporated into the upper vessel member 3 in the high-pressure processing apparatus 1 shown in, e.g., FIG. 1, it may be so incorporated into the lower vessel member 2 as to be movable relative to the holder 4 or may be built independently of, but near the two vessel members 2, 3.

The transferring apparatus 12 is also applicable to various processing apparatuses other than the high-pressure processing apparatus 1 and the material and shape of the article W are not restricted in the present invention.

Although the upward and downward movements of the lower vessel member 2 and those of the upper vessel member 3 are independently controllable by the unillustrated opening/closing means in the foregoing embodiment, only one of the lower and upper vessel members 2, 3 is actually movable while the other thereof is fixed according to the present invention. In such a case as well, the lower and upper vessel members 2, 3 are movable relative to each other.

Further, in the foregoing embodiment, the holder 4 is integrally assembled with the lower vessel member 2 and is movable between the intermediate position where the article W is held by the transferring apparatus 12 and the position where the article W is held by the holder 4 as the lower vessel member 2 is moved upward and downward by the unillustrated opening/closing means: hence, the opening/closing means serves also as a carrier for moving the transferring apparatus 12 relative to the holder 4. Thus, there is an advantage of a simplified apparatus construction. However, this carrier may be provided separately from the opening/closing means.

Specifically, it is sufficient for the carrier to change a distance between the part (supporting protuberances 4b in the shown example) of the holder 4 to be held in contact with the article W and the lower vessel member 2 upon holding the article W at the processing position. For example, the above carrier, i.e., the means for carrying the article W between the intermediate position and the processing position by vertically moving the receiving members 15 of the transferring apparatus 12 relative to the holder 4 can be built even by a driving mechanism such as a cylinder for changing the distance between the holder 4 and the lower vessel member 2 or by forming the rotatable shafts 14 of the transferring apparatus 12 extendible and incorporating an extending mechanism for extending the rotatable shaft into each rotatable shaft.

As described above, an inventive method for transferring an article to be processed, which is carried by a carrier device, to a holder provided in a processing chamber defined by a processing vessel and adapted to hold the article at a specified processing position, comprises the steps of: receiving the article carried by the carrier device at an intermediate position near the holder by a temporarily holding member separate from the carrier device, and temporarily holding the article; retracting the carrier device from the intermediate position while leaving the article held by the holder; relatively moving the temporarily holding member and the holder such that the article temporarily held by the temporarily holding member is transferred to the processing position; and retracting the temporarily holding member to a position in an outside of the processing vessel after the article is transferred to the processing position.

Also, an inventive transferring apparatus for transferring an article to be processed, which is carried by a carrier device, to a holder provided in a processing chamber defined by a processing vessel and adapted to hold the article at a specified processing position, comprises: a temporarily holding member switchable between a temporarily holding position of receiving the article carried by the carrier device at an intermediate position near the holder from the carrier device and temporarily holding the article and a retracted position of resting in an outside of the processing vessel; a position switcher for switching the temporarily holding member between the temporarily holding position and the retracted position; and a carrier for relatively moving the temporarily holding member and the holder such that the article temporarily held by the temporarily holding member at the intermediate position is transferred to the processing position.

Further, an inventive processing apparatus comprises the processing vessel and the transferring apparatus.

With the above transferring method, transferring apparatus, and processing apparatus, the carrier device used to carry the article to the processing position can be retracted from the processing vessel after transferring the article to the temporarily holding member of the transferring apparatus at the intermediate position. Accordingly, the processing vessel does not need to have a space or clearance for avoiding the interference with the carrier device. Further, when a processing is performed in the processing chamber defined by the processing vessel, the temporarily holding member is retracted at the retracted position in the outside of the processing vessel. Accordingly, the space of the processing chamber can be remarkably reduced because it is not required to define another space for accommodating the temporarily holding member. Also, it is possible to form the processing chamber without any problem and to process the article.

Here, the temporarily holding member may be disposed independently of the processing vessel. However, a construction for supporting the temporarily holding member can be simplified if the temporarily holding member is so mounted on the processing vessel as to be movable relative to the holder.

The temporarily holding member may include an article holding portion for supporting the article from below at the temporarily holding position. In such a case, the temporarily holding member is preferably movable toward the temporarily holding position in a horizontal direction or an obliquely upward direction.

It may be preferable that the processing vessel includes a first vessel member having the holder and a second vessel member having such a shape as to cover the holder of the first vessel member, and that the two vessel members can be opened and closed between a united position where they are united with each other so that the second vessel member covers the holder and defines the processing chamber together with the first vessel member and separated positions where the two vessel members are separated to expose the holder to the outside. In such a case, the transferring apparatus preferably transfers the article from the intermediate position to the holder with the two vessel members located at the separated positions.

With such an arrangement adopted, if opening and closing directions of the two vessel members coincide with directions in which the article temporarily held by the holder is carried between the intermediate position and the retracted position, and the article is carried between the intermediate position and the retracted position as the two vessel members are opened and closed, means for opening and closing the two vessel members, i.e., means for relatively moving the vessel members to unit and separate them, can be also used as the carrier.

This application is based on patent application No. 2003-96851 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A processing apparatus adapted for processing an article carried by a carrying device, the processing apparatus comprising:
    a holder adapted to hold an article at a specified processing position,
    a processing vessel formed with a processing chamber inside, including a first vessel member on which the holder is provided and a second vessel member arranged above the first vessel member, the two vessel members being operable to make a relative vertical movement therebetween from respective united positions where they are united with each other to define a processing chamber in which the holder is positioned, to respective separated positions where they are separated from each other to expose the holder to the outside and vice versa,
    a transferring apparatus for receiving the article carried by the carrying device and transferring the article to the processing position,
    wherein the transferring apparatus includes:
    a temporary holding member switchable between a temporary holding position of receiving the article at an intermediate position above the holder and temporarily holding the article and a retracted position of resting outside of the processing vessel;
    a position switcher provided on an outside of the processing chamber for switching the temporary holding member between the temporary holding position and the retracted position; and
    a relatively moving carrier for causing the relative vertical movement of the two vessel members such that the article temporarily held by the temporary holding member at the intermediate position is transferred to the processing position,
    wherein the second vessel member has a skirt portion surrounding the process chamber,
    the temporary holding member includes a plurality of rotatable shafts rotatably mounted on a vertical axis in the skirt portion of the second vessel member and projecting from the skirt portion toward the first vessel member and a plurality of temporary-holding-member main bodies each projecting in a radial direction of the rotatable shaft from the rotatable shaft, and the position switcher rotates the rotatable shafts to switch over the temporary holding member between the temporary holding position where the temporary-holding-member main bodies temporarily hold the article and the retracted position where the temporary-holding-member main bodies are outside the process chamber defined by the two vessel members and outside an outer peripheral surface of the first vessel member at the united positions, and
    the temporary holding member transfers the article from the intermediate position to the process position on the holder with the relative and vertical movement of the two vessel chambers.

2. A processing apparatus according to claim 1, wherein each of the temporary-holding-member main bodies includes a first article supporting portion for supporting the article from below at the intermediate position.

3. A processing apparatus according to claim 2, wherein the carrying device includes a second article supporting portion for supporting the article from below during the carriage of the article, and the thickness of each of the first article supporting portion is smaller than that of the second article supporting portion.

4. A processing apparatus according to claim 2, wherein the holder includes a supporting projection projecting upward from a main body of the holder to locally support a specific part of the article from below, and a projecting distance of the supporting projection is set such that a clearance larger than the thickness of the article supporting portion is defined between the bottom surface of the other part of the article and the main body of the holder with the bottom surface of the article locally held in contact with the supporting projection.

5. A processing apparatus according to claim 1, wherein the temporary holding members are located in such a manner as to be arranged along an outer periphery of the article when the article is carried into the intermediate position, and hold an outer peripheral portion of the article at the temporary holding positions thereof and are retracted to the retracted positions located more outward than the temporary holding positions and located outside the vessel members when the two vessel members are united.

* * * * *